United States Patent [19]
Gruber et al.

[11] Patent Number: 5,291,371
[45] Date of Patent: Mar. 1, 1994

[54] THERMAL JOINT

[75] Inventors: Peter A. Gruber, Mohegan Lake; Arthur R. Zingher, White Plains, both of N.Y.

[73] Assignee: International Business Machines Corporation, Armonk, N.Y.

[21] Appl. No.: 515,906

[22] Filed: Apr. 27, 1990

[51] Int. Cl.$^5$ ............................................. H05K 7/20
[52] U.S. Cl. ................................... 361/705; 174/16.3
[58] Field of Search .................... 165/80.3, 185; 174/16.3; 357/81, 82; 361/382-383, 385-389

[56] References Cited

U.S. PATENT DOCUMENTS

| | | | |
|---|---|---|---|
| 3,405,323 | 10/1968 | Surty et al. | 317/100 |
| 3,626,252 | 12/1971 | Cath | 317/100 |
| 4,069,497 | 1/1978 | Steidlitz | 357/80 |
| 4,072,188 | 2/1978 | Wilson et al. | 165/80 |
| 4,092,697 | 5/1978 | Spaight | 361/386 |
| 4,109,707 | 8/1978 | Wilson et al. | 165/46 |
| 4,151,547 | 4/1979 | Rhodes et al. | 357/81 |
| 4,226,281 | 10/1980 | Chu | 165/80 A |
| 4,233,645 | 11/1980 | Balderes et al. | 361/385 |
| 4,254,431 | 3/1981 | Babuka et al. | 357/82 |
| 4,258,411 | 3/1981 | Sherman | 361/386 |
| 4,323,914 | 4/1982 | Berndlmaier et al. | 357/82 |
| 4,341,432 | 7/1982 | Cutchaw | 339/112 L |
| 4,381,032 | 4/1983 | Cutchaw | 165/46 |
| 4,384,610 | 5/1983 | Cook et al. | 165/80 A |
| 4,462,462 | 7/1984 | Meagher et al. | 165/80 C |
| 4,494,171 | 1/1985 | Bland et al. | 361/386 |
| 4,531,146 | 7/1985 | Cutchaw | 357/82 |
| 4,546,409 | 10/1985 | Yoshino et al. | 361/387 |
| 4,551,787 | 11/1985 | Mittal et al. | 361/386 |
| 4,558,395 | 12/1985 | Yamada et al. | 361/385 |
| 4,561,011 | 12/1985 | Kohara et al. | 356/81 |
| 4,561,040 | 12/1985 | Eastman et al. | 361/385 |
| 4,567,505 | 1/1986 | Pease et al. | 357/81 |
| 4,602,314 | 7/1986 | Broadbent | 361/386 |
| 4,607,277 | 8/1986 | Hassan et al. | 357/81 |
| 4,612,601 | 4/1986 | Watari et al. | 361/387 |
| 4,639,829 | 1/1987 | Ostergren | 361/386 |
| 4,730,665 | 3/1988 | Cutchaw | 165/80 |
| 4,730,666 | 3/1988 | Flint et al. | 165/80.4 |
| 4,758,926 | 7/1988 | Herrell et al. | 361/385 |
| 4,879,632 | 11/1989 | Yamamoto et al. | 361/386 |
| 4,915,167 | 4/1990 | Altoz | 165/185 |

FOREIGN PATENT DOCUMENTS

| | | | |
|---|---|---|---|
| 0193747 | 9/1986 | European Pat. Off. | H01L 23/46 |
| 0344084 | 11/1989 | European Pat. Off. | H01L 23/40 |

OTHER PUBLICATIONS

D. B. Tuckerman et al, "High-Performance Heat Sinking for VLSI", IEEE Electron Dev. Lett., vol. EDL-2, No. 5, May 1981, pp. 126–129.

Blodgett et al, "Thermal Conduction Module: A High-Performance Multilayer Ceramic Package", IBM J. Res. Develop., vol. 26, No. 1, Jan., 1982, pp. 30–36.

H. Martin, "Heat and Mass Transfer Between Impinging Gas Jets and Solid Surfaces", Advance Heat Transfer, vol. 13 (1977).

R. C. Chu, IBM TDB "Design for Providing Thermal Interface Material Between Narrow Thermal Interface Gaps", vol. 20, No. 7, Dec. 1977, pp. 2761–2762.

R. C. Chu et al, IBM TDB "Force-Free Solid Thermal Conduction Module", vol. 23, No. 3, Aug. 1980, pp. 1123–1124.

J. R. Lynch, IBM TDB, "Air and Liquid Drop Cooled Module", vol. 22, No. 1, Jun. 1979, p. 97.

R. C. Miller, IBM TDB, "Structure for Achieving Thermal Enhancement in a Semiconductor Package", vol. 23, No. 6, Nov. 1980, p. 2308.

J. C. Horvath, IBM TDB, "Cooling Assembly for Solder-Bonded Semiconductor Devices", vol. 27, No. 7A, Dec. 1984, p. 3915.

*Primary Examiner*—Gregory D. Thompson
*Attorney, Agent, or Firm*—Perman & Green

[57] ABSTRACT

A thermal joint for transferring heat from a first object to a second object contains a first relatively thick layer of high bulk thermal conductivity material and a second relatively thin layer of lubricant. In a preferred embodiment an anti-adhesion coating is also present in the joint. The thermal joint completely fills the gap between the first and second objects while enabling relative sliding motion to compensate for any lateral distortion.

49 Claims, 8 Drawing Sheets

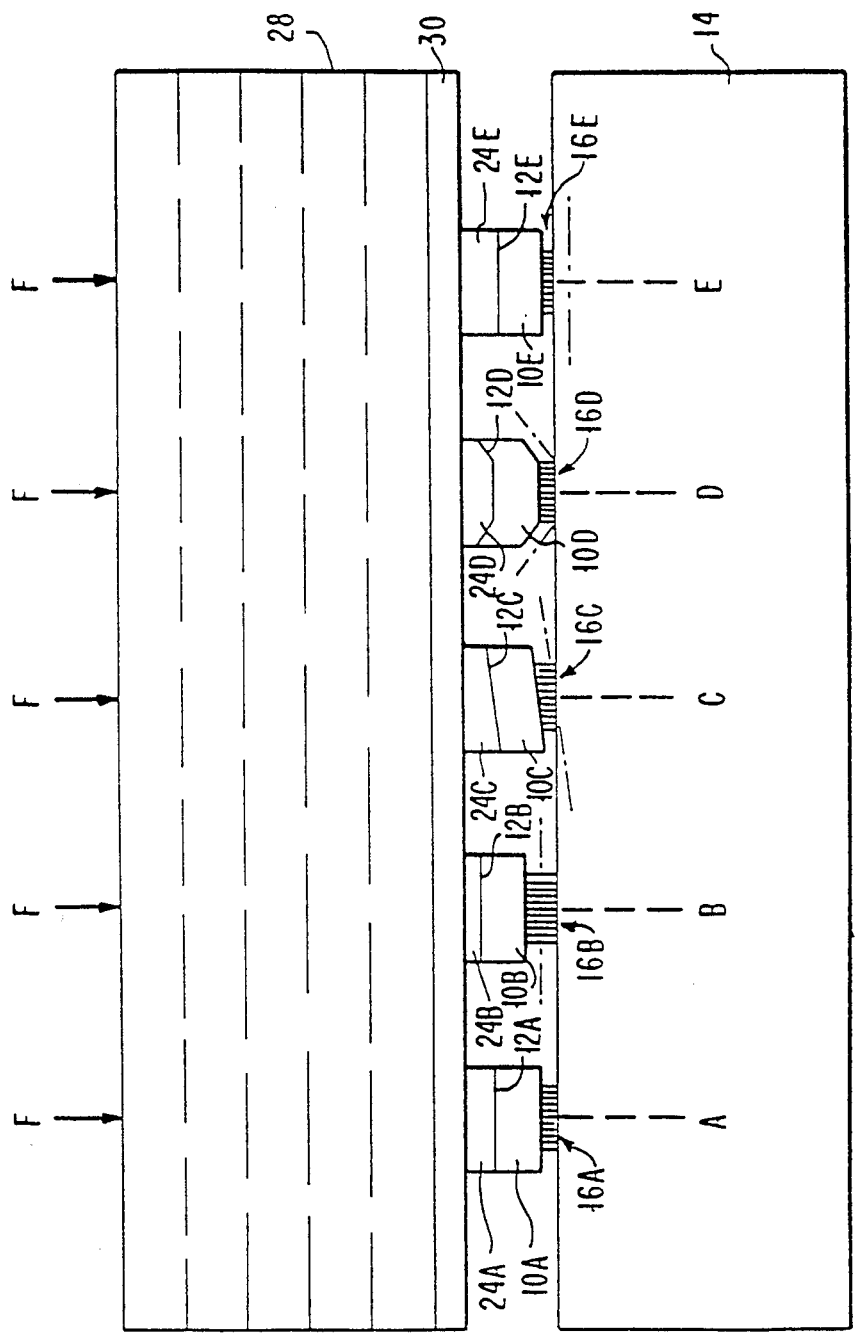

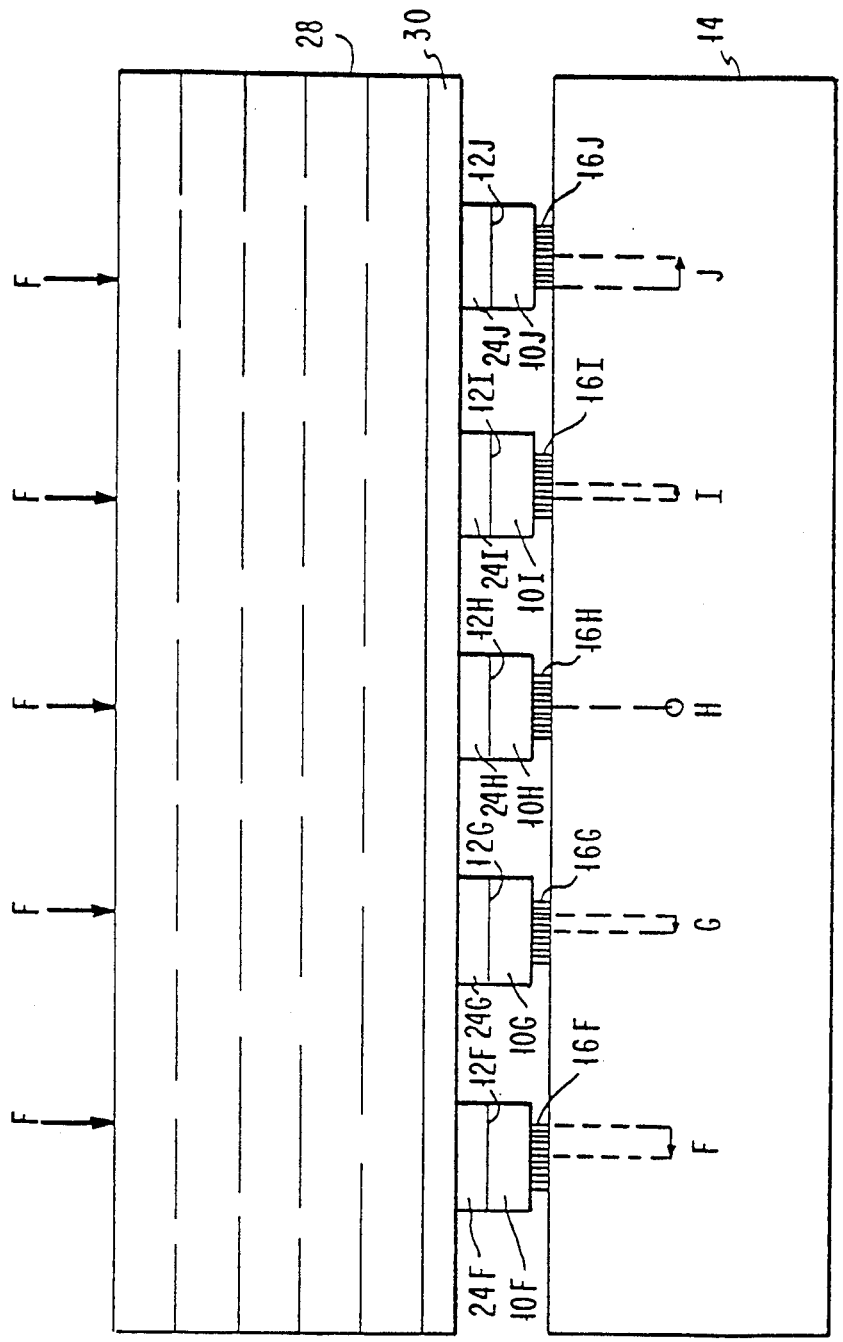

THERMAL JOINT

BACKGROUND OF THE INVENTION

The present invention relates to a thermal joint for transferring heat from a first surface such as a surface of an integrated circuit chip to a second surface such as a surface of a cooling hat. Specifically, the invention relates to a thermal joint comprising a first relatively thick layer of high bulk thermal conductivity material and a second relatively thin layer of lubricant. The thermal joint completely fills the gap between the first and second surfaces while enabling relative sliding motion to compensate for any lateral distortion. The resultant thermal joint exhibits high areal thermal conductivity.

High speed computers and other fast electronic systems often require assemblies of many integrated circuit chips where each chip contains many active devices, and many chips are spaced closely together. During normal operation the devices dissipate a very large power density, especially bipolar transistor devices. Proper electronic operation of the devices necessitates a cool operating temperature which, in turn, requires adequately cooling of the power density. Conversely the maximum allowable operating temperature of the devices and integrated circuit chips in combination with the limited cooling capability presently available limit the allowable power density, circuit density and system speed. Improved device and integrated circuit chip cooling results in increased permissible power density, circuit density and system speed.

The prior art contains many forms of cooling. One form of cooling which has been proposed is the use of a metal plate held against circuit chips by springs, as is disclosed by Cutchaw in U.S. Pat. No. 4,381,032. A heat exchanger incorporating a deflectably movable diaphragm in forced engagement with an integrated circuit package is disclosed by Cutchaw in U.S. Pat. No. 4,341,432. Another form of heat exchanger for cooling electronic circuits provides for passages within which liquid coolant is circulated, the coolant contacting a flexible wall which is urged against the circuitry to be cooled as shown by Wilson et al, in U.S. Pat. No. 4.072,188. Another form of heat exchanger employs coated metallic dendrites which are held by springs against a circuit chip as disclosed by Babuka et al in U.S. Pat. No. 4,254,431. Yet another form of heat exchanger employs a pillow structure formed of a film and filled with a thermal liquid material for extracting heat from an electric circuit, as is disclosed by Spaight, in U.S. Pat. No. 4,092,697. Also a malleable dimpled wafer is deformed by pressure between a heat source such as an electronic circuit and a heat sink, as is disclosed by Rhoades et al in U.S. Pat. No. 4,151,547. Other United States patents showing a single layer of material interposed between a circuit chip and a cooling device are Steidlitz, U.S. Pat. No. 4,069,497; Balderes et al, U.S. Pat. No. 4,233,645; Yoshino et al, U.S. Pat. No. 4,546,409; Kohara et al, U.S. Pat. No. 4,561,011; Hassan et al, U.S. Pat. No. 4,607,277; Watari, U.S. Pat. No. 4,612,601; Ostergren et al, U.S. Pat. No. 4,639,829; and Meagher et al, U.S. Pat. No. 4,462,462. The use of liquid and reentrant cavities at a thermal interface is disclosed by Pease, Tuckerman and Swanson in U.S. Pat. No. 4,567,505. The use of a composite structure of a conformal coating plus liquid at a thermal interface is disclosed by Berndlmaier et al, in U.S. Pat. No. 4,323,914. A theoretical discussion of cooling considerations is presented in an article in the IEEE Electron Devices Letters, "High Performance Heat Sinking For VLSI" by D. B Tuckerman and R. F. W. Pease, Vol. EDL-2, No. 5, May 1981. Broadbent, U.S. Pat. No. 4,602,314 and Sherman, U.S. Pat. No. 4,258,411 disclosed a flexible thermally conductive body disposed between a semiconductor device and a beat sink. U.S. Pat. No. 3,626,252 discloses a silicone grease loaded with thermally conductive particles disposed between a heat sink and an electronic device.

A well known thermal joint is a single thin layer of oil disposed between a chip and a cooling means. A crude thermal joint is a dry joint between a chip and a cooling means. Such a thermal joint provides contact only at tiny asperities, and everywhere else there are tiny air gaps and poor thermal conduction.

The foregoing cooling systems are inadequate for modern electronic systems, particularly bipolar clips packaged closely together in a Multi Chip Module. Therefore, a piston-linkage cooling system has been used. One example of such a cooling system is described in the IBM Journal of Research and Development, Vol 26 No. 1, January 1982. In the described arrangement approximately 100 bipolar semiconductor chips are each bonded face down. Numerous small solder balls connect each chip to a common printed circuit. The solder ball is a Controlled Collapse Chip Connector (so-called C4 connectors), and the printed circuit is a Multi-layer Ceramic substrate. Adjacent to these chips is a cooling hat. Each chip is adjacent to a small piston disposed in a socket in a water cooled metal block. During operation, each chip generates heat which is removed. The heat is conducted from the back of the chip, across a small gas-filled gap to the tip of the piston, along the length of the piston, across another gap to the socket, through the metal block, and finally is removed by convection into the flowing water. In some modifications the piston tip is made flat for better thermal contact with the chip, there is oil between the chip and the piston, and there is a thermal paste between the piston and the socket. The modifications provide a certain degree of improved cooling ability.

The piston is designed for movement within its socket to compensate for manufacturing tolerances and thermal distortions. To compensate for chip height variations, the piston is made to slide in the socket in a direction perpendicular to the chip surface. To compensate for chip tilt variations, the piston is designed to tilt within the socket. To compensate for lateral distortions (due to non-uniform thermal expansion), the piston tip is able to slide laterally over the chip surface or alternatively to slightly rotate or slide laterally in its socket. The various compliance modes prevent chip-to-chip variations from causing large stresses and hence damage. However, achieving the compliance modes requires sufficient clearance between the chip and the piston, and between the piston and the socket. Each clearance adds thermal resistance to the design.

The prior art cooling schemes contain shortcomings and limitations. In order to effectively remove heat from high power density chips, where many chips are closely packaged on a multichip module, a "tight" thermal path is required from each chip to the coolant. The tight thermal path requirement conflicts with a "loose" path requirement such as is required for the above described compliance modes. In order to protect the fragile C4 connectors, the cooling system must not apply large stresses. Unfortunately, manufacturing variations result in significantly different chip heights and tilts. Also, differential thermal expansion significantly distorts the geometry of the system components so that a completely rigid system would develop excessive stresses. Temperature changes cause thermal expansion or contraction of the chips, substrate and cooling hat. The thermal expansion depends on the material involved, and is generally different for each element. During start up and cool down, there is non-uniform temperature and expansion, which also causes unequal thermal expansion and resultant thermal distortions. If not compensated, damaging stresses may develop at interconnections between the elements. For example, unequal thermal distortion parallel to the substrate surface will cause shear stress and eventual failure of the C4 balls. Such a failure mode must be prevented.

As electronic systems continue to advance, the piston linkage and other cooling systems noted above become inadequate. In some cases, there is too much thermal resistance. In still other cases, the cooling does not provide adequate compliance to counteract variations and distortions. In still other cases, the system is excessively complex when applied to a Multi Chip Module containing many chips.

One example of the general problem is the design conflict manifest in piston cooling. To improve heat transfer typically requires tighter clearance, tolerance, and smoothness (from chip to piston tip, and from piston to socket). By contrast, adequate motion and economical manufacturing favor a design with looser clearance, and the like.

One partial solution is to use oil or thermally enhanced paste in the gaps between elements (i.e., between the chip and the piston, or between the piston and the socket). Another partial solution is to design a more sophisticated geometry in which the piston and block are reshaped to increase their contact area. For example, the piston may be reshaped to increase the area adjacent to the metal block. Nevertheless these partial solutions while beneficial do not fully resolve the design conflict.

A single chip module in combination with a printed circuit board may also be employed to package many chips close together. An example is a dual in-line package containing one chip, attached leads, and a plastic housing. The single clap modules are mounted on a common printed circuit board. Some applications might employ single chip modules with a printed circuit board to achieve close chip packing density and high chip power density. Even using such designs, when there is very high performance, a design conflict is manifest between the requirements of a "tight path" for high thermal conductivity and a "loose path" for mechanical compliance of the cooling system element.

Patent applications, entitled "Convection Transfer System" and "Compliant Fluidic Cooling Hat", assigned to the same assignee as the present application, also concerning heat transfer and cooling are being filed concurrently with the present application and are incorporated herein by reference.

SUMMARY OF THE INVENTION

The present invention overcomes the limitations found in the prior art by providing a thermal joint exhibiting the characteristics of superior heat conduction or transfer from a chip to a cooling hat, superior manufacturability including assembly, and the provision of a thermal joint which provides compensation for chip-to-chip manufacturing variations and thermal effects including manufacturing variation in chip height and chip tilt, and thermal distortions and the like caused thereby.

The thermal joint will be described in terms of cooling integrated circuit chips on a horizontally disposed printed circuit substrate. However the joint applies equally as well to other types of electronic components, to other substrate orientations, and to transferring heat between non-electronic components. For example, the joint is applicable to cooling individually packaged chips on a printed circuit card or board. The thermal joint can also be used to transfer heat from hot fluid to cool components.

A preferred embodiment of a thermal joint according to the present invention is the locating of a thermal joint between the top surface of an integrated circuit chip and the bottom surface of a cooling hat or other cooling means. The thermal joint comprises a high thermal conductivity planarized layer (sometimes hereafter referred to as a "shim") and a thin layer of a lubricant. In a modification of the joint, a retainer, preferably of plastic tape, covers the chip surface. The retainer is perforated at positions located over the center region of the chip and is sealed around the edges of the chip. In a one embodiment, the retainer is approximately 38 $\mu$m thick. The high thermal conductivity layer is preferably a solder which solidifies or freezes at a moderately low temperature. The layer is typically between 20 $\mu$m and 50 $\mu$m thick after planarization. The oil or lubricant layer is typically less than 1 $\mu$m thick. Preferably there is also an anti-adhesion coating which is a few molecules thick.

As the electronic system is turned on and off, the various electronic and cooling elements undergo thermal changes and slightly expand and contract. The substrate and cold hat expand and contract unequally, so there is a slight relative lateral distortion. If the system were rigid, shear stress would be produced on the electronic connections from the chip to the substrate. In some cases, these connectors are tiny fragile solder balls. Cyclic stress would cause irreversible metallurgical dislocations and after many cycles, the connection will exhibit cracking.

The lubricant layers allow lateral movement in the joint thereby relieving lateral distortion and stress. The oil layer reduces dynamic friction and fills in any remaining gap. The anti-adhesion coating, if added, reduces static friction. Each high thermal conductivity layer is planarized so that its top surface is at a standard location in the thermal joint. The layer therefore fills in variations in chip height and chip tilt. The bottom surface of the cooling hat is designed to be at a predetermined standard location. Thus each conductive layer mates accurately and gently with the adjacent cooling hat.

Each part of the thermal joint forming the present invention has very good areal thermal conductivity. The conductive layer is relatively thick, but has high bulk thermal conductivity. The oil has poor bulk thermal conductivity, but is much thinner. The anti-adhesion coating is extremely thin. The retainer, if present, does not cover the center of each chip, nor does the retainer cover a significant area of the chip top surface.

The system including the thermal joint is highly self aligned in the vertical direction between the top surface of the chip and the bottom surface of the cooling hat.

The cooling hat typically is closer than 50 μm to each chip. The planarized conductive layer fills the gap between the chip and cooling hat, leaving less than a 1 μm tolerance. The lubricant, particularly oil, fills the 1 μm space. Thus, relatively loose manufacturing tolerance and assembly nevertheless achieve fine thermal conduction. Moreover, the resulting thermal joint complies with lateral distortions producing large stress by means of the lubricant and anti-adhesion coating facilitating lateral motion between elements of the system.

A principal object of the present invention is therefore the provision of a thermal joint disposed between two surfaces which joint transfers heat from one surface to the other while compensating for manufacturing tolerances and thermal distortions.

Another object of the invention is the provision of a thermal joint comprising a first layer of a high thermal conductivity material and second thin layer of a lubricant.

A still another object of the invention is the provision of a thermal joint comprising a high thermal conductivity material layer and a lubricant layer and further includes a retainer.

A further object of the invention is the provision of a thermal joint comprising a relatively thick solder layer and thin lubricant layer.

A still further object of the invention is the provision of a thermal joint comprising a first layer of a high thermal conductivity material, a second thin layer of a lubricant and an anti-adhesion coating.

Further and still other objects of the present invention will become more clearly apparent when the following description is read in conjunction with the accompanying drawings.

BRIEF DESCRIPTION OF THE DRAWINGS

FIG. 2 is an elevation cross-section illustrating typical manufacturing variations in assembly requiring vertical compliance in a thermal joint.

FIG. 3 is an elevation cross-section illustrates typical lateral distortions requiring horizontal compliance in a thermal joint.

DETAILED DESCRIPTION

Figure 1:
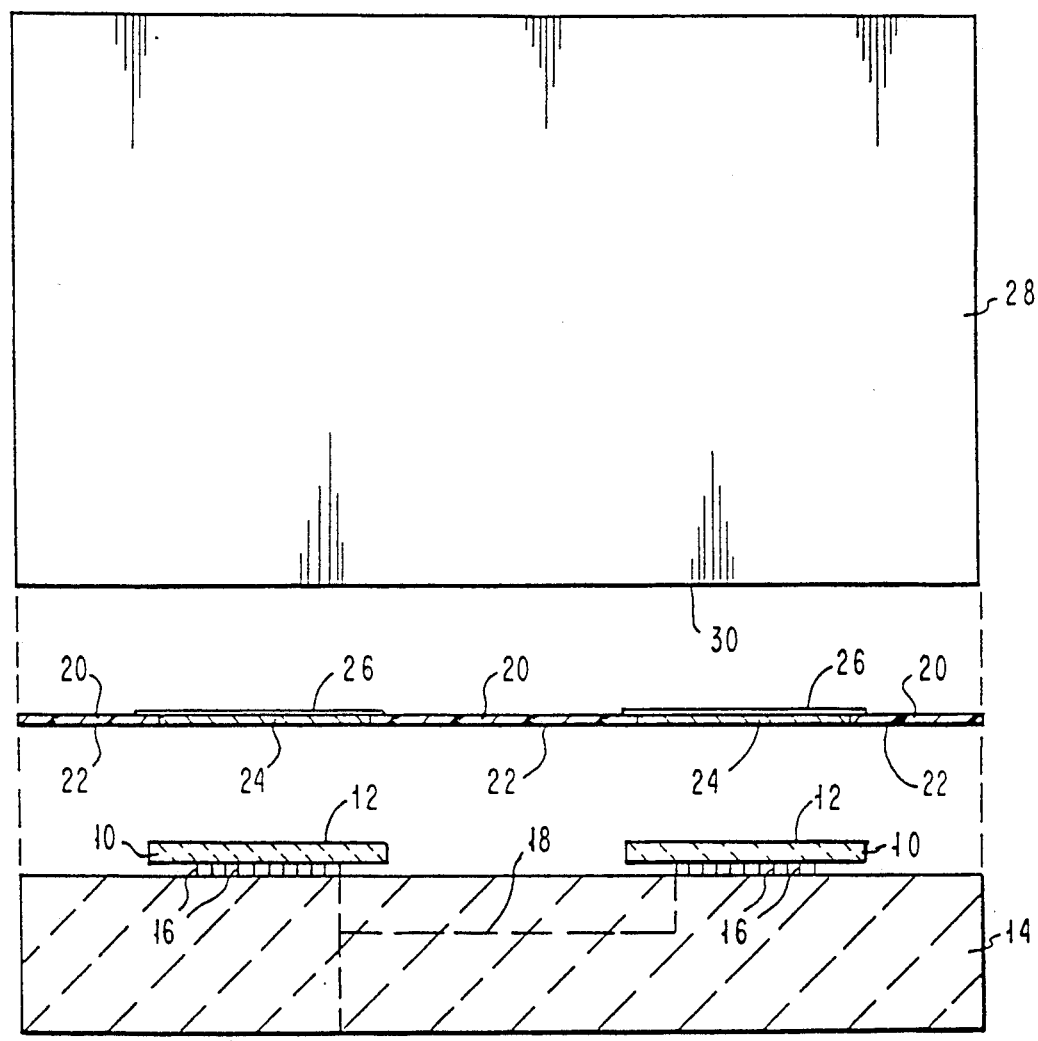
FIG. 1 is an elevation cross-section representation of a preferred embodiment of the thermal joint forming the present invention.

Referring now to the figures and to FIG. 1 in particular where there is shown a preferred embodiment of the thermal joint in accordance with the present invention. While the elements to be described in FIG. 1 are shown separated from each other to facilitate a description of the invention, in operation the elements are in forced intimate contact with one another. An integrated circuit chip 10 having a top surface 12 is connected to a substrate or printed circuit board 14 by means of connections 16, for instance, C4 solder connectors, The printed circuit board 14 contains printed circuit wiring 18. While there, is shown only two chips 10, it will be understood by those skilled in the art that any quantity of chips 10 may be attached in a two dimensional configuration to the printed circuit board 14.

The preferred embodiment of the thermal joint itself comprises a retainer 20 which is disposed over the electronic assembly including chips 10 and substrate 14. The bottom surface of the retainer 20 as oriented In FIG. 1 has a layer of low tack adhesive 22. The retainer is perforated according to a pattern such that a respective perforation appears in the retainer corresponding to the location of the center area of the top surface 12 of a respective chip 10. The adhesive 22 holds the retainer at the edges of the surface 12 and covers only a small portion of the top surface 12 of any chip 10. Alternatively an individual perforated retainer 20 can be placed on the surface 12 of each chip 10 comprising the electronic assembly.

Within each perforation and in contact with surface 12 a layer of high thermal conductivity planarized material 24 is disposed. A thin layer of lubricant 26 is disposed adjacent to the material 24.

The retainer 20 is a plastic tape such as a polyimide film and has a thickness in the range between 5 μm and 40 μm and preferably is approximately 38 μm thick. The high thermal conductivity planarized layer 24 is typically a solder which solidifies or freezes at a moderately low temperature in the range between 85° and 183° C. and is preferably a eutectic solder. The layer is typically between approximately 20 and 50 μm thick after planarization. In one embodiment, the lubricant 26 is an oil layer such as poly-alyphatic olefin with an anti-oxidant additive and is less than approximately one μm thick.

Box 28 represents a "cooling hat" or cooling means for transferring heat from the bottom surface 30 of the cooling hat to a fluid such as water or air flowing in the cooling means. Not shown is means for urging the cooling hat into forced intimate contact with the thermal joining which is then urged into forced intimate contact with the top surface 12 of the chips 10 for providing a thermal path for the heat generated in the chips to travel to the cooling fluid. The means for urging the assembly into forced intimate contact also usually includes a locking mechanism which causes the applied force to maintain the joint closed, even during shock and vibration thereby preventing internal bouncing of the components and entrance of air or a gas into the joint. The construction of the means for urging and the locking mechanism are known in the art.

In a preferred embodiment, the layer of high thermal conductive material 24 is bismuth and tin in the weight ratio of approximately 58:42. The material is eutectic, which melts at 138° C. and serves as a moderately low temperature solder. The melting point is selected to be between the chip operating temperature (typically 85° C.) and the melting point of the electronic connectors 16. Typically the latter temperature is much hotter than 138° C. Upon optical inspection, the Bi-Sn alloy maintains a smooth surface when it freezes in a mold and later stands alone. Apparently, Bi-Sn solder is little susceptible to roughening due to oxidation, density changes upon freezing, or elemental segregation. To prevent trapping air bubbles, the method taught in U.S. Pat. No. 4,685,606 is employed. The material 24 can be any solder with similar properties, such as various indium alloys, or various bismuth alloys or other low temperature alloys. Also, the material 24 may be a metal mixture which slowly hardens by amalgamation.

The thermal joint fabrication is facilitated by use of an alloy with a minimal oxide skin and minimal wrinkling upon freezing. Exemplary alloys are those containing bismuth and tin. Upon exposure to air tin, chrome and certain other metals form a surface oxide which is self-limiting and self-possivating, thus minimizing the oxide skin. Metals such as bismuth, gallium and antimony expand upon freezing. An alloy, including an element which expands upon freezing when combined with an element which contracts upon freezing, results in an alloy having a nearly zero density change upon freezing. Such an alloy does not wrinkle upon freezing. Also, gallium indium, bismuth, and lead all have low melting temperature which is advantageous.

Preferred alloys are those which contain a combination of metals that are self-passivating, expand upon freezing, contract upon freezing, and have a low melting temperature. Preferred alloys are tin or chrome for passivation and expansion; with bismuth or gallium or antimony for expansion; with gallium, indium, bismuth or lead for low melting temperature. The alloys include eutectic and non-eutectic alloys and alloys with two, three or more elements and include solid alloys, plastic-regime alloys and alloys which are solid, paste-like, or liquid alloys.

In a preferred embodiment the lubricant 26 is a low viscosity oil plus an anti-adhesion coating. The oil reduces dynamic friction and provides thermal conduction across an approximately one micron thick range gap. The coating reduces static friction and may enhance the wetting of the oil. A preferred oil is poly-alyphatic olefin with an anti-oxidant additive. The oil does not chemically attack near-by electronic components. The thermal joint must minimize adhesion/static friction. This is not automatically accomplished by use of a conventional liquid lubricant which reduces dynamic friction. In particular, the liquid lubricant might eventually be locally squeezed out an asperity (tiny protrusion) and hence cause adhesion/static friction. Anti-adhesion coatings are used in magnetic disk memories, and the techniques can be adapted from the disk technology to the present invention.

A preferred embodiment of the invention has the anti-adhesion coating located on the bottom surface 30 of the cooling hat 29.

A preferred anti-adhesion coating material is a PFPE (perfluropolyether) with an attachment group and a molecular weight of approximately 3000. Monte Edison Inc. of Italy manufacturers such a product under the name "Froblin Oil". An example of a method for applying the coating is as follows. Make a dilute solution of the anti-adhesive in a solvent. Spread a thin layer of the solution on a chemically clean coldsheet surface. Bond the coating by baking or drying. Rinse off any unbonded coating with a solvent. The remaining bonded solution leaves a securely bonded coating.

Other coating materials are Nyebar, manufactured by Nye Inc. and PFPA (perfluropolyacrylate), manufactured by 3M Inc. Even though the coating is bonded on one surface, local adhesion is prevented on the other surface. It is also possible to use an unbonded coating. In general, the thermal joint may use many types of anti-adhesion coatings. Many such coating have been used in magnetic disk systems and the same technology is transferable to the present invention.

An alternative coating is hydrogenated amorphous carbon deposited over hydrogenated amorphous silicon, having a combined thickness of less than 100 $\mu$m and possibly much thinner. The coating can be applied by chemical vapor deposition to the bottom surface 30 of the cooling hat 28. An organic liquid lubricant readily wets the coating. In combination both the static and dynamic friction are reduced.

More generally, the thermal joint may include many other oils and coatings having similar properties. These oils include silicone oil, mineral oil, perflurocarbon oil, gallium or other liquid metal. Other anti-adhesion coating include perflurocarbon plastic (such as Teflon), graphite, molybdenum trioxide, or other layered materials. Molybdenum disulphide reduces adhesion, but unfortunately it also introduces sulfides, which might eventually chemically attack nearby electronics.

In a preferred embodiment the retainer 20 includes a polyimide (such as Kapton) film approximately 13 $\mu$m thick. Such a retainer easily tolerates the temperature necessary to melt the solder layer as will be described below. In preferred embodiment the adhesive 22 is a cured rubber such as synthetic polyisoprene, which is sometimes called "synthetic natural rubber". This is weakly adherent and can be peeled off cleanly, as will be described below. Clean peering is important to prevent residues which later degrade the thermal conduction of the joint. Since the adhesive is synthetic, its chemical properties are better defined than true natural rubber. More generally, the retainer can use many other plastics and adhesives with similar properties.

In one example, the thermal joint vertical dimensions of the adhesive layer 22 is typically 13 $\mu$m thick and the retainer 20 is typically 25 $\mu$m thick. The tilt of chips in an electronic assembly can vary within the range of $\pm 60$ $\mu$m compared to the nominal value. The height of the chips can vary within the range of $\pm 20$ $\mu$m height value. Thus the minimum thickness of the high bulk thermal conductivity layer 24 is calculated to be the sum of the adhesive layer thickness, retainer thickness and maximum variation of tilt and height, or a total of 100 $\mu$m. As a result of the tilt, the layer 24 may be tapered. The lubricant layer thickness is determined by considering several factors: surface texture of the top surface of the layer 24, the surface texture of the bottom surface 30 of the cooling hat 28, and the geometric mismatch between the two mentioned surfaces. Typically, the lubricant layer thickness is between 0.5 and 5 $\mu$m. However, it is preferable to use the thinnest practical layer which still allows sliding or lateral motion. Under static compression, slight non-planarities ("asperities") in the opposed surfaces will slowly penetrate into the lubricant layer. This solid to solid contact results in static friction. The anti-adhesion coating minimizes the static friction. The coating is ultra-thin, typically between a few molecular layers and 0.1 $\mu$m.

These vertical dimensions result in a high thermal conductivity per unit area. In accordance with the joint design, the affect of the poor bulk thermal conductivity of the lubricant is minimized by virtue of the thinness of the layer. At the same time, high bulk thermal conductivity of layer 24 compensates for the thickness of the layer. The anti-adhesion layer is ultra thin.

In a preferred embodiment, the joint lateral dimensions typically are as follows: the chips are 4.5 mm wide mounted on a 8.5 mm pitch, the retainer perforation is 3.5 mm wide yielding a border of 0.5 mm inboard of each edge. The material 24 disposed in the perforation (sometimes hereafter referred to as a solder preform) has a volume of 1.8 mm³, which is slightly greater than the volume of the largest gap (4.5 mm×4.5 mm×0.0087 mm=1.76 mm³) between the chip and the bottom of the cooling hat. Depending on the particular volume difference, there will be more or less excess material 24 or solder. After the thermal joint is assembled (as will be explained below), the excess material will be on top of the retainer and outboard of the chip.

FIGS. 2 and 3 illustrate the concept of joint compliance. For clarity of the description, the manufacturing tolerances and thermal distortions are shown greatly exaggerated.

In FIG. 2, several representative vertical variations are illustrated by five chips, identified as 10A to 10E. Chip 10A illustrates an "ideal" chip. Chip 10B illustrates a chip which is too high. Chip 10C illustrates a tilted chip. Chip 10D illustrates a curved chip. Chip 10E illustrates a chip which is too low. Typically these vertical variations are 0 to 50 μm thick. The dashed lines indicate the nature of each of these variations. For each chip 10A to 10E there is a respective layer of thermal conductive material 24A to 24E between the top surface 12A to 12E of each respective chip and the bottom surface 30 of the cooling means 28. The assembly process (as explained below) readily achieves the required vertical compliance thereby eliminating large compression/tension stresses on the components.

FIG. 3 shows chips 10F to 10J having lateral variations in displacement ranging from far left in the case of chip 10F to far right in the case of chip 10J. Typically these horizontal displacements are less than 25 μm. Dashed lines and small arrows illustrate these displacements. Only chip 10H is in the ideal location. During repeated ON-OFF cycles of the electronic system nonuniform thermal expansion causes lateral differential motion between a chip and the adjacent cooling means. As a result of the lubricant layer disposed between high thermal conductivity material 24 and the bottom surface 30 of the cooling hat 28, there is sliding in the joint, which prevents shear stress in the connections 16F to 16J.

While the above description refers to the general compliance or compensation provided in both the vertical and horizontal directions as drawn, the combination of a high bulk thermal conductive material layer and thin lubricant layer, thermal joint cannot provide all the compliance required for joining integrated circuit chips to ceramic substrates by means of C4 connectors. In particular there are certain variations, such as distortions in a direction perpendicular to the substrate surface which occur after the layer 24 has been planarized and long range curvature in the substrate whose sagitta considerably exceeds the maximum layer 24 thickness. The use of a springy cooling hat is able to provide compliance for these substrate variations. Also, the springiness maintains the thermal joint in mild compression for reducing joint failures.

FIGS. 4A through 4K illustrate the preferred method of assembling a thermal joint in accordance with the present invention. Before, assembling the thermal joint, the chips are attached to the substrate, the cooling hat is assembled, and the anti-adhesion coating is applied to the bottom surface of the cooling hat. The thermal joint is then ready to be assembled. While the following description refers to a single chip, it will be understood by those skilled in the art that a plurality of thermal joints are simultaneously being assembled for each chip in the electronic assembly.

Figure 4A:
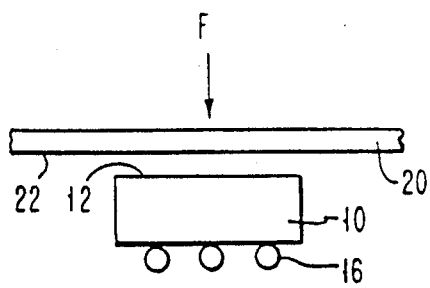
FIGS. 4A-4K are schematic representations of a preferred method of assembling a thermal joint in accordance with the present invention.

In FIG. 4A a retainer tape 20 with an adhesive layer 22 is held firmly above and in close proximity to the electronic assembly. Then a pneumatic force F is applied which causes the tape to contact the top surface 12 of a chip. Thereafter, the adhesive layer causes weak adhesion of the tape 20 to the top surface 12 of the chip.

Figure 4B:
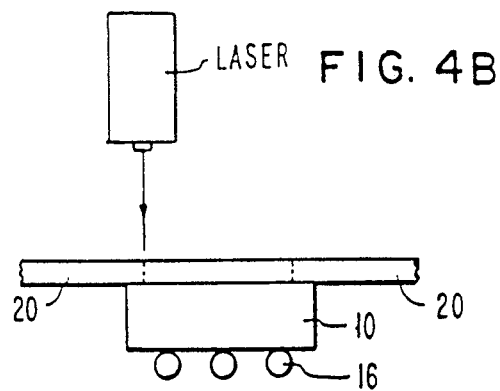

In FIG. 4B the tape 20 is perforated in a region adjoining the central area of the top surface of a respective chip. Preferably the perforation is achieved by UV laser ablation.

Figure 4C:
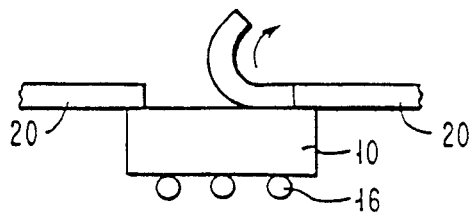

In FIG. 4C the cut pieces of tape are removed, preferably by peeling back the material by use of a roller coated with a matching pattern of strong adhesive. It is highly desirable to peel the tape cleanly. Otherwise any residue must be carefully removed, since any remaining adhesive will degrade heat conduction.

Figure 4D:
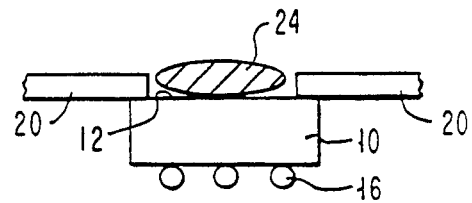

In FIG. 4D, a small solder preform 24 is placed on the top surface 12 in approximately the center of each chip in the region where the tape was removed.

Figure 4E:
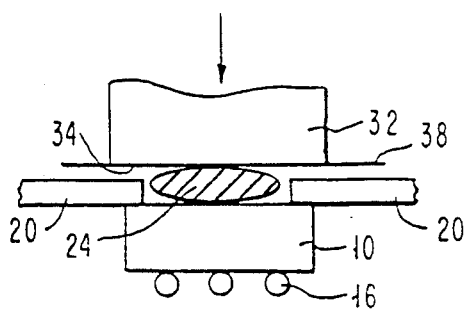

In FIG. 4E a forming tool 32 having a smooth frontal surface 34 is placed over the entire assembly. In a preferred embodiment, the forming tool 32 is a smooth flat rigid plate at least the frontal surface of which is covered with a very smooth thin "release sheet" of plastic 38 such as Kapton. An alternative embodiment of the forming with tool 32 has a metal frontal surface covered by an anti-adhesion coating.

Figure 4F:
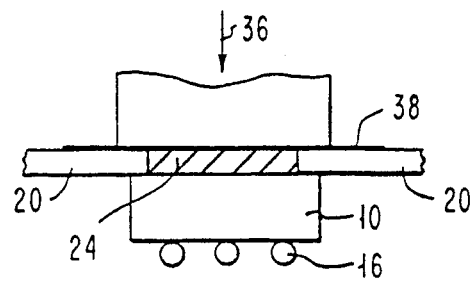

In FIG. 4F the solder preform is heated, and the forming tool is urged towards the assembly in the direction of arrow 36. In a preferred embodiment, the entire assembly is heated slowly and uniformly. Thus the temperature of all the elements is uniform, which minimizes some of the thermal distortions.

Figure 4G:
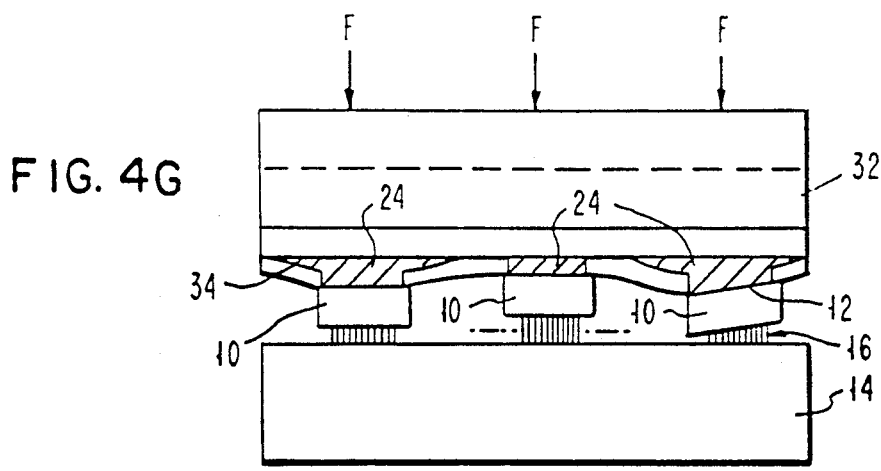

In FIG. 4G the solder liquifies and flows. Each solder preform is dimensioned to completely fill the gap within the perforated tape from the top surface of the chip to the frontal surface of the forming tool. Thus, the solder is planarized by reflow to match the forming tool geometry. Concurrently, any excess solder overflows from the chip to the adjacent retainer. The retainer adhering to the edge region of the chip keeps any excess solder away from the electronic assembly thereby avoiding any electrical short circuit.

The solder is allowed to cool and freeze with the forming tool in place. Preferably, the cooling is uniform in order to minimize thermal distortions.

Figure 4H:
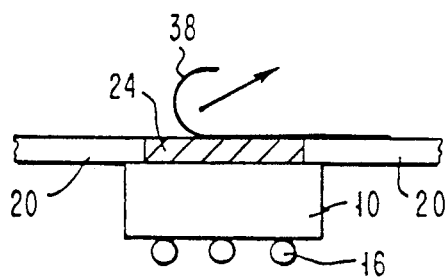

In FIG. 4H the forming tool 32 is removed from the assembly without disturbing the planarized solder surface. Preferably, the tool is lifted off and then a release sheet 38 is peeled off the cooled solder. To facilitate clean peeling, roll back of the release sheet is done with a sharp radius of curvature. Clean peeling is desired in order to prevent degradation of the thermal conduction of the joint.

Figure 4I:
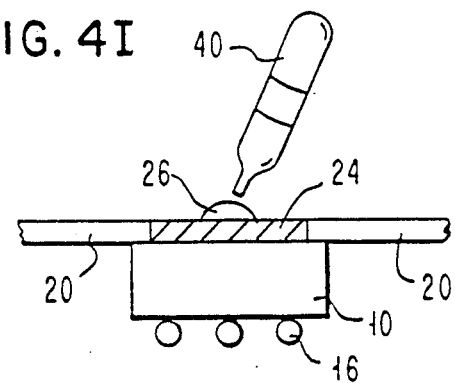

In FIG. 4I a tiny droplet of lubricant 26 is placed on each planarized solder surface from a calibrated micropipette 40 or equivalent device.

Figure 4J:
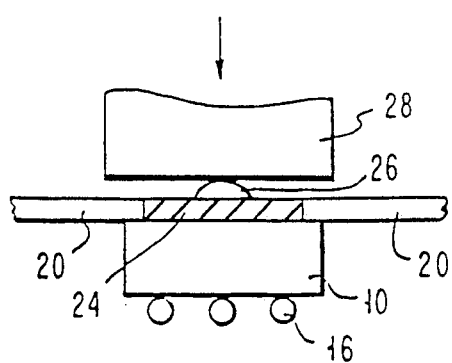

In FIG. 4J the cooling means 28 is placed atop the thermal joint and electronic assembly. The drop of lubricant 26 extrudes into a thin layer over each chip between the chip 10 and cooling means, When the lubricant viscosity is low, it will readily form a thin layer. When the lubricant viscosity is high, some other technique is needed to achieve a thin layer. Therefore, simultaneous squeezing and shearing of the cooling means and the electronic assembly is required. The method of simultaneous squeezing and shearing is described in pending patent application Ser. No. 07/161,880, filed Feb. 29, 1988.

Figure 4K:
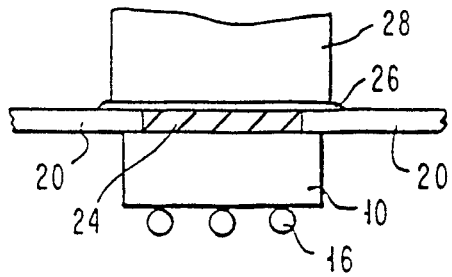

In FIG. 4K the cooling means is gently forced against the thermal joint and electronic assembly, where it is locked together in a known manner in order to maintain the applied force.

Figure 5:
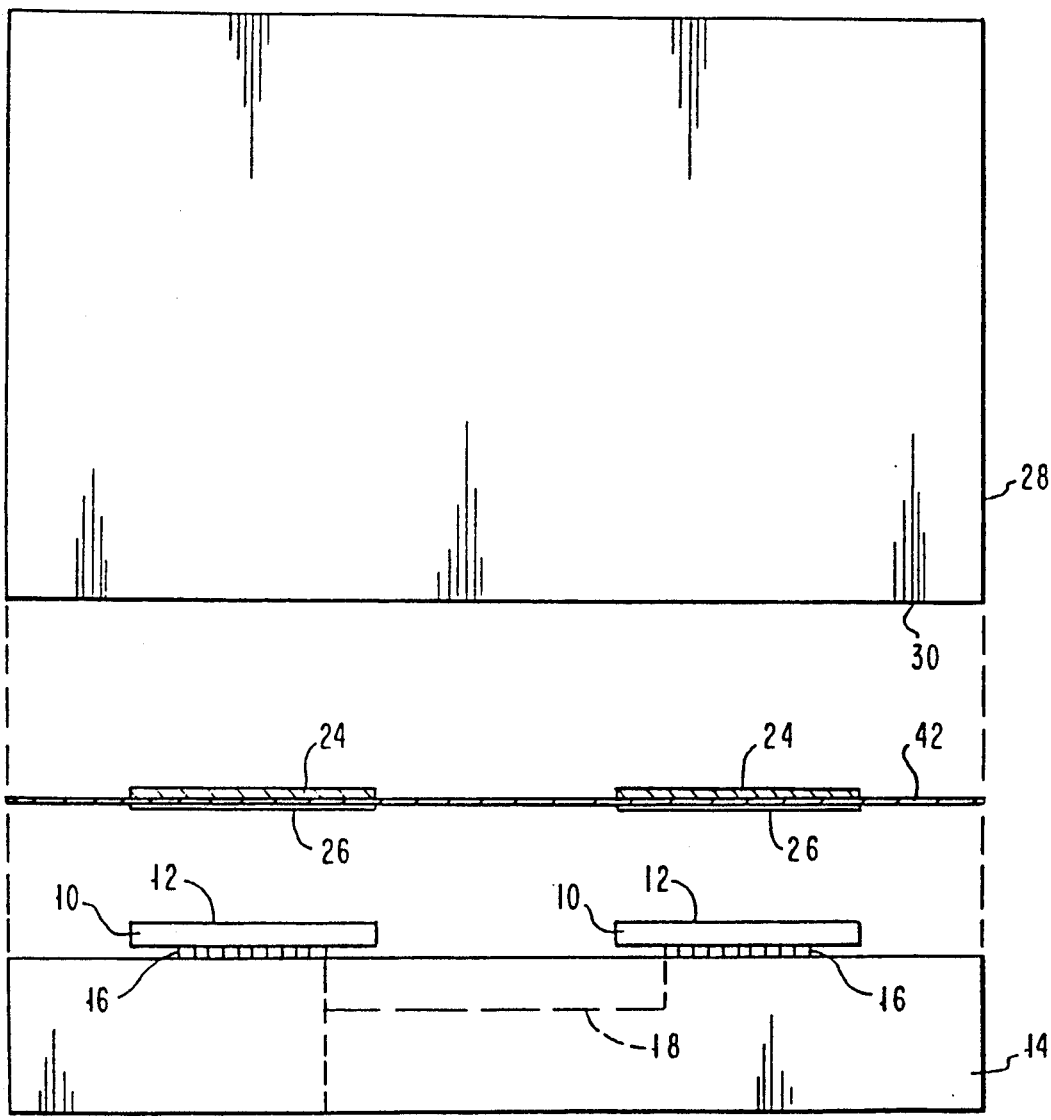
FIG. 5 is an elevation cross-section representation of the thermal joint shown in FIG. 1 including a foil layer.

FIG. 5 shows a modification of the thermal joint assembly described above, Where the same components are shown in both FIGS. 1 and 5, the same reference numeral will be used to facilitate an understanding of the invention.

The thermal joint shown in FIG. 5 includes a thin metal foil 42. The thermal joint assembly includes a lubricant layer 26 disposed directly on the top surface 12 of chip 10. Surrounding the electronic assembly, i.e. a plurality of chips 10, is a thin metal foil 42. The high bulk thermal conductive layer 24 is located on the top surface of the foil 42 at locations corresponding to the location of the respective chips 10. In contrast to the thermal joint in FIG. 1, the joint in FIG. 5 does not contain a perforated retainer tape. The embodiment shown in FIG. 5, heat is conducted directly through the foil 42. At the edge region of the substrate 14, the foil is hermetically sealed to the substrate.

In order to prevent the foil from contacting the edge of chip 10 and thereby preventing the chip from undergoing lateral motion, the bottom surface of the foil 42 is made downwardly convex or the top of the chip 10 is made upwardly convex. The shape is achieved by embossing the foil in the regions over the centers of respective chips. The solder preform when melted will fill the gap between the embossment and the cooling means. The foil also serves the additional function of retaining any excess solder.

Other methods to prevent contact between the foil and edges or corners of the chips is to make the edges and corners of each chip slightly round or alternatively to form a distinct convex button shaped mass on the foil. For example, start with a thin foil and add button shaped masses to the foil, or start with a thicker foil and etch partway through to leave button shaped masses. Yet another solution is to make the back of each chip slightly convex, for example by sputtering or by bonding a button shaped mass thereto.

The addition of a foil 42 to the thermal joint provides the advantage of additional sealing for the electronic assembly. The use of a sealed assembly facilitates electronic assembly or cooling means replacement. Also, use of a foil layer having button shaped projections can be used to compensate for vertical variations in the assembly, as discussed below in connection with FIG. 6.

Figure 6:
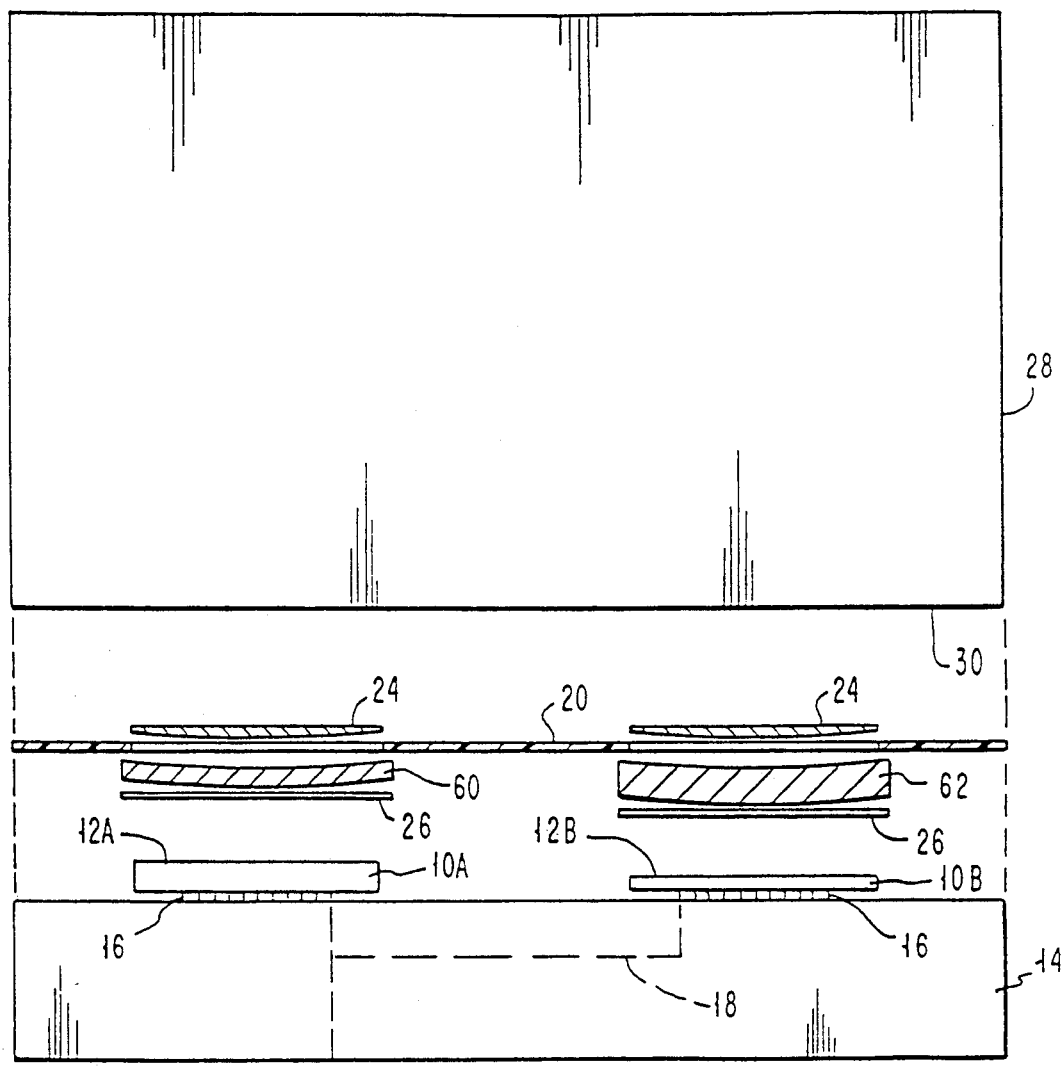
FIG. 6 is an elevation cross-section representation of thermal joint including a retainer and buttons.

A modified embodiment of the thermal joint is shown in FIG. 6, which includes metal buttons 60, 62 and a tape retainer layer 20. This embodiment compensates for large vertical differences, and can be pre-assembled or pre-fabricated, which facilitates final assembly. Also in this embodiment the high thermal conducting layer (e.g. solder) is separated from the electronic components.

The thermal joint assembly includes a lubricant layer 26 disposed directly on the top surface 12A and 12B of the chips 10A and 10B. Above each chip is a button 60, 62 of material with very high thermal conductivity, such as copper. The thicknesses of the buttons 60, 62 compensate for large pre-determined differences in the thicknesses of chips 10A, 10B. Above the buttons 60, 62 and surrounding the electronic assembly, there is a perforated retainer layer 20. Above the retainer layer 20, there is a layer 24 with high bulk thermal conductivity, such as low melting solder. The button 60, 62 nevertheless allows the layer 24 to fill gaps, and the lubricant layer 26 permits sideways sliding movement.

In order to prevent trapped air bubbles in the lubricant layer 26, the adjacent button surface should be slightly convex. This can be done by inelastically bending ("coining") each button between a pair of dies, or by slightly grinding or polishing each button. To prevent the button from catching at the edge of the chip, the button size should be slightly different from the chip size. In order to make the retainer, in combination with the buttons, have very low chemical permeability, a very thin metal overcoat is deposited. The structure of oil-to-button-to-solder is particularity useful if chip bowing is small, or at least predeterminable (e.g. several microns variation in the sagitta).

The retainer 20 and the buttons 60, 62 can be preassembled, for instance, by using methods analogous to those with chips.

For mass production, the retainer 20 and buttons 60, 62 can pre-fabricated like a printed circuit. For example, starting with a metal sheet (e.g. copper 0.5 mm thick) inelastically bend this sheet between a pair of dies with multiple shallow curved areas to make convex buttons. Apply resist, and etch part-way into one side of the metal. (The etch process should be chosen to minimize roughness, and may be followed by electrochemical polishing. Also the solder will eventually fill the surface roughness on one side.) The result is a metal sheet with areas of various thicknesses which will eventually become the required button thicknesses. Next, laminate a thin polymer layer on the metal sheet. Then, lithographically mark the buttons in resist upon the metal. Etch away unwanted metal. The desired buttons are thus laminated to a polymer sheet. Apply resist to the polymer layer, lithographically mark the desired openings, and etch away unwanted polymer. This completes fabrication of the retainer and buttons. Finally apply a solder preform on top of the buttons and retainer. One skilled in the art of printed circuit processes can fabricate this retainer and buttons in many different ways (e.g. additive fabrication; dry etching of polymer).

This pre-assembly or pre-fabrication of the retainer and buttons has advantages. These steps can be performed at a location remote from the chips, including tape lamination and cutting or etching. However to properly reflow the solder, the buttons must contact the chips. Even so, the pre-assembly facilitates keeping excess solder away from the electronics.

Alternative thermal joint construction include: lubricant/button/foil/shim or lubricant/button/foil/retainer/solder or and lubricant/button/retainer solder.

The foil embodiments are generally similar to embodiments with a perforated retainer. However foil provides tighter sealing but requires more complex fabrication. The term "barrier layer" as used herein refers both to a retainer with perforations and buttons, and also to a foil with large areal thermal conductivity but no perforations and with or without buttons.

The barrier layer (foil 42 or retainer 20 with buttons 60, 62) and layer 24 may adhere to one another. The described embodiment permits layer "wetted metallurgical" adhesion, or a "non-wetted" weaker adhesion. The adherent high thermal conductivity layer does not impede sliding on the bottom of the barrier at the lubricant layer 26 adjacent to the chip.

For rework, the system is separated at the lubricant layer, and the barrier, layer 24, and cooling means are removed as a single unit. However, if rework requires replacing a chip, then the barrier and layer 24 must be renewed and planarized again. Depending on the adhesion between the layer 24 and the bottom surface 30 of the cooling means 28, replacing the bottom surface may be required.

Additional alternative thermal joint assemblies are possible. For example, the anti-adhesion coating is applied to top of the solder, instead of to the bottom of the cooling means. The lubricant layer is applied directly to the chip and underneath the layer 24 thereby alleviating stresses within the chip due to unequal thermal expansion between the chip and layer 24.

The lubricant layer is applied to the bottom of the cooling means and the top surface of the chip. The thermal joint structure is chip, high thermal conductivity layer, lubricant layer, high thermal conductivity layer and cooling means. That is, a second high bulk thermal conductivity layer is disposed between the lubricant layer and the cooling means. Such an arrangement is particularly advantageous when both heat transfer surfaces are rough. In an alternative arrangement each solder layer is planarized independently using a method similar to that described above. It is also feasible that only the solder layer in contact with the chip is planarized. When the electronic assembly and cooling means are assembled or reassembled a new solder preform is used which is planarized in situ as described below. Such an arrangement facilitates field replacement with tight tolerances. However, a disadvantage of the arrangement is the complexity of the replacement process and the joint construction. In addition, the thermal resistance is increased. A further alternative joint construction is the forming of a stack in the form of a chip, a perforated retainer, a solder layer, a lubricant layer, foil layer, solder layer and the cooling means. Such an arrangement prevents the foil layer from contacting the corner edge of the chip. The arrangement fills any gap between the foil layer and the cooling means and provides additional sealing. Unfortunately, the assembly structure is unduly complex. In an arrangement where the solder layer only contacts with lubricant on the chip, the excess solder must not surround the chip edges to avoid joining of the chip to the bottom of the cooling means and thereby prevent lateral motion.

There are several alternative methods of assembling the thermal joint with regard to the retainer tape. For example, the electronic assembly is inverted while the solder is being planarized so that gravitational forces keep the excess solder against the frontal surface of the forming tool and away form the electronic assembly. Assembling the joint in this manner reduces the necessity for a retainer.

Adhesive is not placed on the retainer tape. Pneumatic pressure difference maintains the retainer tape in position against the chip. Near the edge of each chip, the laser slightly melts the retainer tape to join the retainer to the chip. An IR laser is preferred laser in such a method. The plastic welding step may precede or coincide with the laser cutting process.

In an alternative method, the perforations are exit in the retainer tape before being placed over the chips. The retainer can be cut by inexpensive die cutting, thus eliminating the cut and peel steps described above. However, cutting and alignment tolerances become more critical requiring a wider margin region and smaller perforation area to achieve a reliable seal near the edges of each chip. In some instances, it is important that all chips be at the same temperature even though the power is very different. This is achieved by use of a "customized" retainer which has perforation sizes corresponding to the respective power per chip. After the chips and substrate are fabricated, assembled and tested then the power is measured or calculated for individual chips in the electronic assembly. The retainer is applied to the chips and custom cut, preferably with a laser. The more power generated in the chip, the larger the size of the cutout required to retain the reformed solder, and the better the thermal contact. The assembly is now complete.

Some applications do not require the excellent thermal conductivity achieved by molten solder re-flow. Therefore, the labor required for the inclusion of a tape retainer spacer is not justified. In such cases, the solder may be adequately planarized by plastic creep without melting. That is, the solder is merely pressed between the chip and the forming tool (or the cooling means). It is also possible in such case to warm the solder to a temperature below the melting point. In contrast with planarization by melting, planarization by plastic creep facilitates the maintaining of the excess solder away from the electronics assembly, hence reducing the need for the retainer.

The amount of creep required occurs near room temperature or with only slight heating. Many soft solder alloys have a low yield strength at a temperature slightly below the melting temperature. In particular, most non-eutectic alloys have a "plastic regime" of temperatures, where the alloy is intermediate between a crystalline solid and a true liquid and when the alloy softens and creeps gradually, but does not liquefy. Plastic creep allows planarization at an intermediate temperature, over a longer time, and without a tape retainer spacer. In contrast, a eutectic solder alloy abruptly changes state from solid to liquid.

There are alternative methods for planarizing the solder layer such as by using a mechanical process, such as cutting, polishing, or by a chemical - mechanical process. The alternative methods allow additional methods materials, particularly materials with very high thermal conductivity to fill very wide gaps. These materials include high conductivity copper, doped polyacetylene, or other electrically and thermally conducting plastics. In another alternative embodiment, the high thermal conductivity layers are planarized after being coupled to the electronic assembly. However, care is required to avoid the application of excessive force on the electronic connections and to prevent excess material from causing electrical short circuits. In still another embodiment, before the thermal joint is assembled, the non-coplanarity of each chip is measured and the thermal conductivity layer is mechanically shaped to match the non-coplanarity. In a further modification, a mechanically shape macroscopic layer is coupled with a planarized microscopic layer. While a mechanically shaped layer generally adds complexity, the filling of very wide gaps become possible. Shape layers are also useful where there is a large predictable non-coplanarity.

Variations concerning the lubricant layer are also possible. For example, before applying the lubricant layer, the lubricant is dissolved in a solvent. A large drop of the resulting mixture is placed on each chip.

The drop spreads and the solvent evaporates, leaving a thin layer of lubricant. This method is vulnerable to dust. Also, if the surface tension is not correct, then the thin lubricant layer will break into isolated microdroplets.

Alternatively, the lubricant is applied by vapor transport from a warm lubricant bath to a cool surface of the cooling means or the high thermal conductive layer or the chip (depending on the thermal joint structure).

Additional modifications to the above described assemblies are possible. For instance, the cooling means is used as a forming tool. The solder planarization and lubricant spreading are performed simultaneously in situ by urging the cooling means toward the electronic assembly. As a result the planarized solder conforms to the bottom surface of the cooling means. Unfortunately this technique tends to form pockets of lubricant which degrade thermal conduction and degrades sliding.

Another assembly modification permits the elimination of the retainer tape. By inverting the electronics assembly before and during solder reflow and cooling, any excess solder will be extruded from the chip and release sheet, and by virtue of gravitational forces the excess solder will flow away from the electronics assembly and adhere to the release sheet. When the release sheet is subsequently peeled away the excess solder will adhere to the sheet, but the planarized solder disposed over each chip is not disturbed. The differential adhesion affect is achieved in any of several ways. A release sheet and forming tool which have a raised area over each chip and a recessed area outboard each chip can be employed. The recessed area surface promotes solder adhesion and gravitational forces drain away any excess solder. A similar result is possible when the cooling means is used as the forming tool, and the assembly is not separated after reflow. In such case, the lubricant layer should be disposed between the chip and the solder. Another way is to use release sheet with a pattern of anti-adhesion coatings over each chip, and pro-adhesion coating outboard of each chip. A further way is to use a release sheet with a cut-out blotter, instead of a retainer tape, surrounding each chip.

In some instances the nominal shape of the cooling means and electronic assembly is not flat. Therefore, a forming tool which matches the nominal shape is used. In some instances, there is a large and predictable non-coplanarity among the chips. For example, the thickness may be different among memory and logic chips. The difference of the gap may be too large for a solder layer alone to provide compensation. One solution is to selectively add a second high thermal conductivity layer. In one embodiment, etched or plated copper foil which covers the electronic assembly is added to the assembly. The local foil thickness is matched to the nominal non-coplanarity. In an alternative embodiment, there is a dimensionally distinct solder preform used for each chip. Across the entire electronic assembly, the additional solder preforms are retained together on a single adhesive tape to facilitate construction.

The thermal joint described above is not limited solely to applications of cooling by cooling means of integrated circuit chips mounted on a substrate or printed circuit board. One of these other applications is the provision of a heat conduction path between a discrete power component (such as a high power SCR) and an adjacent cooling unit (such as a large metal air cooled heat sink). The thermal joint allows better heat transfer and lower assembly force than conventional methods. Since this application often involves rough surfaces, and therefore a joint construction of high bulk conductivity material layer/lubricant layer/high bulk thermal conductivity material layer is preferred. In contrast, conventional cooling techniques use thermally loaded elastomer as a thermal joint. Such a joint typically provides less thermal contact and requires substantial clamping force. Another prior technique is the use of a thermally loaded paste which provided less thermal contact and is messy to assemble and disassemble.

Figure 7:
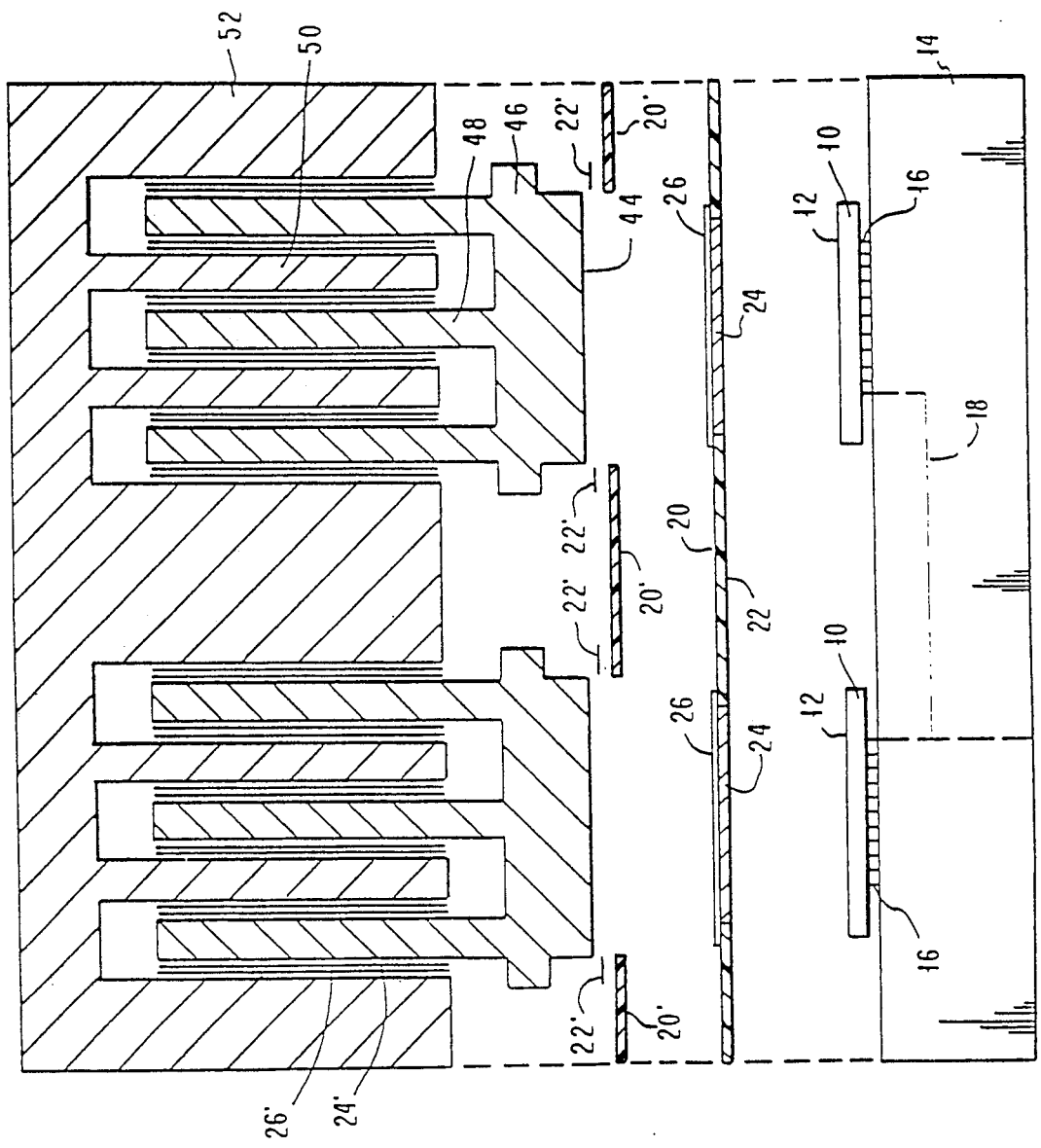
FIG. 7 is an elevation cross-section representation of the thermal joint shown in FIG. 1 including piston linkages.

A further alternative embodiment is shown in FIG. 7 when the thermal joint is combined with a piston linkage. The thermal joint is the same as that shown in FIG. 1 with the cooling hat 28 replaced by a piston linkage. The thermal joint is disposed between the chip 10 and the face 44 of an associated piston 46. The same joint construction (indicated with prime notation) is used between the side of piston fin 49 and the adjacent block fin 50 in the cooled block 52. A second retainer 20' and adhesive layer 22' holds the retainer 20' between pistons 46. When using this technique, planarization by plastic creep and inverting the assembly during planarization, and perhaps the elimination of the retainer is preferred. In each arrangement, the novel thermal joint facilitates heat conductor and provides some compliance between components forming the assembly. In particular the thermal joint readily provides tilt compliance which is difficult to relieve with piston linkages. The described arrangement reduces the design conflict between good heat transfer and loose manufacturing clearance.

Depending on the application either or both thermal joint locations is preferable. There is considerable redundancy in the compliance provided by both the thermal joint between the chip and the piston 46, and the thermal joint between the piston fin 48 and block fin 50. The design may be simplified to a single joint of a solder layer with lubrication plus lubrication of a single joint with lubricant only, and the piston linkage.

The thermal joint in accordance with the present invention can be used symbiotically with a cooling means whose bottom surface is a coldsheet made of a bendable metal sheet. Such a construction is described in a co-pending patent application entitled "Component Fluidic Cooling Hat". The present thermal joint compensates for lateral distortion by sliding of the lubricant layer, fills gaps in the range to 0.025 to 0.100 mm and complies with a substrate curvature having a radius in excess of several meters. A workable cooling system typically requires each of the three mentioned compliance modes. If any one of the modes is missing, proper cooling will be lacking. Therefore, the thermal joint in combination with the coldsheet forms a symbiotic cooling system.

A "chip cube" structure contains multiple chips laminated together. The edges are grooved to form a flat face. Electrical connections are made through metallization along the chip edges. The chip cube is useful for very high density packaging of memory chips with few connections per chip and with low power per chip. Grinding the edges on the side opposite from the electrical connection result in flat surface through which heat can be removed through the thermal joint forming the present invention. As used hereinabove, electronic component or chip will be understood to include the chip cube structure.

The thermal joint was describe in terms of cooling for nearly horizontal flat electronic components. Nevertheless the joint has more universal use. It can be used to conduct heat into a cool object, as well as to conduct heat form a warm object, It can be used in many heat transfer applications, to conduct heat between adjacent objects, not just components of an electronic systems.

The present invention also provides for rework of the system. For example, consider a repair to a multichip module and cooling hat, connected together by a quantity of thermal joints. The cooling hat can be removed from the thermal joint and module. The high conductivity pieces can be removed and the retainer peeled off of the chips. The module is now accessible for rework. The system can be subsequently reassembled by following the same procedure as the original construction of the thermal joint.

While there has been described and illustrated a preferred embodiment of a thermal joint and modifications and variations thereof, it will be apparent to those skilled in the art that further modifications and variations are possible without deviating form the broad scope of the present invention which shall be limited solely by the scope of the claims appended hereto.

What is claimed is:

1. A thermal joint adapted to be disposed between a first heat emitting object and second heat removing object for transferring heat from the first object to the second object while providing compliance for object dimensional variation and thermally induced object variations, the thermal joint comprising:
    a first layer of high bulk thermal conductivity material adapted to be located in thermal contact with the heat emitting object, and
    a second layer in contact with said first layer, said second layer being a lubricant having a thickness thinner than said first layer, and said second layer being adapted to be located in thermal contact with the heat removing object;
    wherein said first layer is a solder having a melting temperature in the range between 85° C. and 183° C.

2. A thermal joint as set forth in claim 1, wherein said first layer is a metal.

3. A thermal joint as set forth in claim 1, wherein said second layer is less than one-third of the thickness of said first layer.

4. A thermal joint as set forth in claim 1, wherein said first layer is greater than 10 microns thick and said second layer is less than 3 microns thick.

5. A thermal joint as set forth in claim 1, wherein said first layer is eutectic solder.

6. A thermal joint as set forth in claim 1, wherein said second layer is selected from the group consisting of low viscosity poly-alyphatic olefin, mineral oil, silicone oil, synthetic oil, gallium and liquid metal.

7. A thermal joint as set forth in claim 1, further comprising retainer means adapted for positioning said first layer relative to said first object.

8. A thermal joint adapted to be disposed between a first heat emitting object and a second heat removing object for transferring heat from the first object to the second object while providing compliance for object dimensional variation and thermally induced object variations, the thermal joint comprising:
    a first layer of high bulk thermal conductivity material adapted to be located in thermal contact with the heat emitting object; and
    a second layer in contact with said first layer, said second layer being a lubricant having a thickness thinner than said first layer, and said second layer being adapted to be located in thermal contact with the heat removing object;
    wherein said first layer is Bi/Sn solder and said second layer is poly-alyphatic oil.

9. A thermal joint adapted to be disposed between a first heat emitting object and a second heat removing object for transferring heat from the first object to the second object while providing compliance for object dimensional variation and thermally induced object variations, the thermal joint comprising:
    a first layer of high bulk thermal conductivity material adapted to be located in thermal contact with the heat emitting object;
    a second layer in contact with said first layer, said second layer being a lubricant having a thickness thinner than said first layer, and said second layer being adapted to be located in thermal contact with the heat removing object; and
    an anti-adhesion coating.

10. A thermal joint as set forth in claim 9 wherein said anti-adhesion coating is selected from the group consisting of perfluropolyether, perfluropolyacrylate, perflurocarbon and molydenum disulfide.

11. A thermal joint adapted to be disposed between a first emitting object and a second heat removing object for transferring heat from the first object to the second object while providing compliance for object dimensional variation and thermally induced object variations, the thermal joint comprising:
    a first layer of high bulk thermal conductivity material adapted to be located in thermal contact with the heat emitting object;
    a second layer in contact with said first layer, said second layer being a lubricant having a thickness thinner than said first layer, and said second layer being adapted to be located in thermal contact with the heat removing object; and
    a metal foil layer disposed between said first layer and said second layer.

12. A thermal joint as set forth in claim 1 wherein said first layer is an alloy comprising a first metal that is self-passivating and a second metal that expands upon freezing.

13. A thermal joint adapted to be disposed between a first heat emitting object and a second heat removing object for transferring heat from the first object to the second object while providing compliance for object dimensional variation and thermally induced object variations, the thermal joint comprising:
    a first layer of high bulk thermal conductivity material adapted to be located in thermal contact with the heat emitting object;
    a second layer in contact with said first layer, said second layer being a lubricant having a thickness thinner than said first layer, and said second layer being adapted to be located in thermal contact with the heat removing object; and
    a button layer disposed between said first layer and said second layer, said button layer having a bulk thermal conductivity and thickness greater than that of said first layer.

14. A thermal joint as set forth in claim 13 further comprising a barrier layer disposed between said button layer and said first layer.

15. A thermal joint as set forth in claim 14 wherein said barrier layer comprises foil.

16. A thermal joint adapted to be disposed between an electronic component and a cooling means for transferring heat between the component and the cooling means and for compensating for dimensional variations and thermally induced variations of the component, the thermal joint comprising:
- a first layer of high bulk thermal conductivity material adapted to be located in thermal contact with the electronic component, and
- a second layer in contact with said first layer, said second layer being a lubricant having a thickness thinner than said first layer, and said second layer being adapted to be located in thermal contact with the cooling means;

wherein said first layer is eutectic solder.

17. A thermal joint as set forth in claim 16, wherein said first layer is a solder and said second layer is less than one-third the thickness of said first layer.

18. A thermal joint adapted to be disposed between an electronic component and a cooling means for transferring heat between the component and the cooling means and for compensating for dimensional variations and thermally induced variations of the component, the thermal joint comprising:
- a first layer of high bulk thermal conductivity material adapted to be located in thermal contact with the electronic component; and
- a second layer in contact with said first layer, said second layer being a lubricant having a thickness thinner than said first layer, and said second layer being adapted to be located in thermal contact with the cooling means;

wherein said first layer is solder and said second layer is poly-alyphatic oil.

19. A thermal joint adapted to be disposed between an electronic component and a cooling means for transferring heat between the component and the cooling means and for compensating for dimensional variations and thermally induced variations of the component, the thermal joint comprising:
- a first layer of high bulk thermal conductivity material adapted to be located in thermal contact with the electronic component; and
- a second layer in contact with said first layer, said second layer being a lubricant having a thickness thinner than said first layer, and said second layer being adapted to be located in thermal contact with the cooling means;

wherein said second layer is selected from the group consisting of low viscosity poly-aliphatic olefin, mineral oil, silicone oil, synthetic oil, gallium and liquid metal.

20. A thermal joint adapted to be disposed between an electronic component and a cooling means for transferring heat between the component and the cooling means and for compensating for dimensional variations and thermally induced variations of the component, the thermal joint comprising:
- a first layer of high bulk thermal conductivity material adapted to be located in thermal contact with the electronic component;
- a second layer in contact with said first layer, said second layer being a lubricant having a thickness thinner than said first layer, and said second layer being adapted to be located in thermal contact with the cooling means; and
- an anti-adhesion coating.

21. A thermal joint as set forth in claim 20, wherein said anti-adhesion coating is selected from the group consisting of perfluropolyether, perfluropolyacrylate, perflurocarbon and molybdenum disulfate.

22. A thermal joint adapted to be disposed between an electronic component and a cooling means for transferring heat between the component and the cooling means and for compensating for dimensional variations and thermally induced variations of the component, the thermal joint comprising:
- a first layer of high bulk thermal conductivity material adapted to be located in thermal contact with the electronic component;
- a second layer in contact with said first layer, said second layer being a lubricant having a thickness thinner than said first layer, and said second layer being adapted to be located in thermal contact with the cooling means; and
- a metal foil layer disposed between said first layer and said second layer.

23. A thermal joint as set forth in claim 16 wherein said first layer is an alloy comprising a first metal that is self-passivating and a second metal that expands upon freezing.

24. A thermal joint adapted to be disposed between an electronic component and a cooling means for transferring heat between the component and the cooling means and for compensating for dimensional variations and thermally induced variations of the component, the thermal joint comprising:
- a first layer of high bulk thermal conductivity material adapted to be located in thermal contact with the electronic component;
- a second layer in contact with said first layer, said second layer being a lubricant having a thickness thinner than said first layer, and said second layer being adapted to be located in thermal contact with the cooling means; and
- a button layer disposed between said first layer and said second layer, said button layer having a bulk thermal conductivity and thickness greater than that of said first layer.

25. A thermal joint as set forth in claim 24 further comprising a barrier layer disposed between said button layer and said first layer.

26. A thermal joint as set forth in claim 25 wherein said barrier layer comprises foil.

27. A thermal joint adapted to be disposed between an electronic component and a cooling means for transferring heat between the component and the cooling means and for compensating for dimensional variations and thermally induced variations of the component, the thermal joint comprising:
- a first layer of high bulk thermal conductivity material adapted to be located in thermal contact with the electronic component;
- a second layer in contact with said first layer, said second layer being a lubricant having a thickness thinner than said first layer, and said second layer being adapted to be located in thermal contact with the cooling means; and
- retainer means disposed for positioning said first layer relative to said component.

28. An electronic assembly including a thermal joint comprising:
- a substrate;
- at least one electronic component attached to said substrate; cooling means;

a thermal joint for transferring heat from said at least one electronic component to said cooling means while providing compliance for manufacturing and for thermally induced variations of said at least one electronic component, said thermal joint comprising:
a first layer of planarized high thermal conductivity material adapted to be in thermal contact with said at least one electronic component, and
a second layer of lubricant having a thickness less than that of said first layer, said second layer being adapted to be in thermal contact with said cooling means;
wherein said second layer is selected from the group consisting of low viscosity poly-aliphatic olefin, mineral oil, silicone oil, synthetic oil, gallium and liquid metal.

29. An electronic assembly as set forth in claim 28, wherein said first layer is a metal.

30. An electronic assembly as set forth in claim 28, wherein said first layer is solder.

31. An electronic assembly as set forth in claim 28, wherein said solder is a bismuth-tin eutectic solder.

32. An electronic assembly including a thermal joint comprising:
a substrate;
at least one electronic component attached to said substrate;
cooling means;
a thermal joint for transferring heat from said at least one electronic component to said cooling means while providing compliance for manufacturing and for thermally induced variations of said at least one electronic component, said thermal joint comprising:
a first layer of planarized high thermal conductivity material adapted to be in thermal contact with said at least one electronic component; and
a second layer of lubricant having a thickness less than that of said first layer, said first layer and said second layer being adapted to be disposed between said at least one electronic component and said cooling means, said second layer being adapted to be in thermal contact with said cooling means;
wherein said thermal joint further comprises an anti-adhesion coating.

33. An electronic assembly as set forth in claim 32, wherein said anti-adhesion coating is selected from the group consisting of perfluropolyether, perfluropolyacrylate, perflurocarbon and molybdenum disulfide.

34. An electronic assembly including a thermal joint comprising:
a substrate;
at least one electronic component attached to said substrate;
cooling means;
a thermal joint for transferring heat from said at least one electronic component to said cooling means while providing compliance for manufacturing and for thermally induced variations of said at least one electronic component, said thermal joint comprising:
a first layer of planarized high thermal conductivity material adapted to be in thermal contact with said at least one electronic component;
a second layer of lubricant having a thickness less than that of said first layer, said first layer and said second layer being adapted to be disposed between said at least one electronic component and said cooling means, said second layer being adapted to be in thermal contact with said cooling means; and
a foil layer disposed between said first and second layers and adapted to be coupled to said substrate.

35. An electronic assembly including a thermal joint comprising:
a substrate;
at least one electronic component attached to said substrate;
cooling means;
a thermal joint for transferring heat from said at least one electronic component to said cooling means while providing compliance for manufacturing and for thermally induced variations of said at least one electronic component, said thermal joint comprising:
a first layer of planarized high thermal conductivity material adapted to be in thermal contact with said at least one electronic component; and a second layer of lubricant having a thickness less than that of said first layer, said first layer and said second layer being adapted to be disposed between said at least one electronic component and said cooling means, said second layer being adapted to be in thermal contact with said cooling means;
wherein said thermal joint further comprises retainer means adapted to be disposed on said at least one electronic component.

36. An electronic assembly as set forth in claim 35, wherein said retainer means includes a respective aperture disposed over a central area of an associated said at least one electronic component.

37. An electronic assembly as set forth in claim 36, wherein said retainer means is coupled to each said electronic component in the vicinity of the edges thereof.

38. An electronic assembly as set forth in claim 37, wherein said retainer means is coupled by adhesive means which peels cleanly.

39. An electronic assembly as set forth in claim 36, wherein the size of said respective aperture is commensurate with the power dissipated by said associated said at least one electronic component.

40. An electronic assembly as set forth in claim 34, further comprising retainer means disposed on said at least one electronic component.

41. An electronic assembly as set forth in claim 40, wherein said retainer means includes a respective aperture disposed over a central area of an associated said at least one electronic component.

42. An electronic assembly as set forth in claim 41, wherein said retainer means is coupled to each of said at least one electronic component in the vicinity of the edges thereof.

43. An electronic assembly as set forth in claim 42, wherein said retainer means is coupled by adhesive means which peels cleanly.

44. An electronic assembly including a thermal joint comprising:
a substrate;
at least one electronic component attached to said substrate;
cooling means;
a thermal joint for transferring heat from said at least one electronic component to said cooling means while providing compliance for manufacturing and for thermally induced variations of said at least one electronic component, said thermal comprising:
- a first layer of planarized high thermal conductivity material adapted to be in thermal contact with said at least one electronic component; and
- a second layer of lubricant having a thickness less than that of said first layer, said first layer and said second layer being adapted to be disposed between said at least one electronic component and said cooling means, said second layer being adapted to be in thermal contact with said cooling means;
- wherein at least one of said first layer or said cooling means includes a textured surface.

45. An electronic assembly including a thermal joint comprising:
- a substrate;
- at least one electronic component attached to said substrate;
- cooing means;
- a thermal joint for transferring heat from said at least one electronic component to said cooling means while providing compliance for manufacturing and for thermally induced variations of said at least one electronic component, and thermal joint comprising:
- a first layer of planarized high thermal conductivity material adapted to be in thermal contact with said at least one electronic component; and
- a second layer of lubricant having a thickness less than that of said first layer, said first layer and said second layer being adapted to be disposed between said at least one electronic component and said cooling means, said second layer being adapted to be in thermal contact with said cooling means;
- wherein said first layer is an alloy comprising a first metal that is self-passivating and a second metal that expands upon freezing.

46. An electronic assembly including a thermal joint comprising:
- a substrate;
- at least one electronic component attached to said substrate;
- cooling means;
- a thermal joint for transferring heat from said at least one electronic component to said cooling means while providing compliance for manufacturing and for thermally induced variations of said at least one electronic component, said thermal joint comprising:
- a first layer of planarized high thermal conductivity material adapted to be in thermal contact with said at least one electronic component; and
- a second layer of lubricant having a thickness less than that of said first layer, said first layer and said second layer being adapted to be disposed between said at least one electronic component and said cooing means, said second layer being adapted to be in thermal contact with said cooling means; and
- a button layer disposed between said first layer and said second layer, said button layer having a bulk thermal conductivity and thickness greater than that of said first layer.

47. An electronic assembly as set forth in claim 46 further comprising a barrier layer disposed between said button layer and said first layer.

48. An electronic assembly as set forth in claim 47 wherein said barrier layer comprises foil.

49. An electronic assembly including a thermal joint comprising:
- a substrate;
- at least one electronic component attached to said substrate;
- cooling means;
- a thermal joint for transferring heat from said at least one electronic component to said cooling means while providing compliance for manufacturing and for thermally induced variations of said at least one electronic component, said thermal joint comprising:
- a first layer of planarized high thermal conductivity material adapted to be in thermal contact with said at least one electronic component; and
- a second layer of lubricant having a thickness less than that of said first layer, said first layer and said second layer being adapted to be disposed between said at least one electronic component and said cooling means, said second layer being adapted to be in thermal contact with said cooling means;
- wherein said cooing means comprises a bendable compliant bottom surface.

* * * * *